United States Patent [19]

Mashburn

[11] Patent Number: 5,558,788
[45] Date of Patent: Sep. 24, 1996

[54] DUAL BEAM OPTICAL SYSTEM FOR PULSED LASER ABLATION FILM DEPOSITION

[75] Inventor: Douglas N. Mashburn, Knoxville, Tenn.

[73] Assignee: Martin Marietta Energy Systems, Inc., Oak Ridge, Tenn.

[21] Appl. No.: 159,163

[22] Filed: Nov. 30, 1993

[51] Int. Cl.$^6$ .................................................. B23K 26/00
[52] U.S. Cl. .............................. 219/121.68; 219/121.69; 219/121.75; 219/121.77
[58] Field of Search .......................... 219/121.6, 121.61, 219/121.17, 121.65–121.69, 121.76, 121.77, 121.78, 121.79, 121.8; 427/569; 369/44.42

[56] References Cited

U.S. PATENT DOCUMENTS

| | | | |
|---|---|---|---|
| 4,128,752 | 12/1978 | Gravel | 219/121.67 |
| 4,315,130 | 2/1982 | Inagaki et al. | 219/121.67 |
| 4,623,776 | 11/1986 | Buchroeder et al. | 219/121.67 |
| 4,645,900 | 2/1987 | Heyden | 219/121.67 |
| 5,029,243 | 7/1991 | Damman et al. | 219/121.77 |
| 5,209,944 | 5/1993 | Opower et al. | 427/569 |
| 5,223,693 | 6/1993 | Zumoto et al. | 219/121.68 |
| 5,227,608 | 7/1993 | Yoshida et al. | 219/121.68 |

OTHER PUBLICATIONS

Materials Research Society (MRS), vol. 99; Entitled: *High–Temperature Superconductors* (A Symposium held Nov. 30–Dec. 4, 1987, Boston, Massachusetts, U.S.A.).

*Pulsed Laser Deposition of Thin Superconducting Films of $Ho_1Ba_2Cu_3O_{7-x}$ and $Y_1Ba_2Cu_3O_{7-x}$*, by Geohegan et al. (Solid State Division, Oak Ridge National Laboratory, Oak Ridge, TN), J. Mater. Res. 3(6) Nov./Dec. 1988.

$Y_1Ba_2Cu_3O_{7-x}$ *Laser–Ablation Plume Dynamics Measurement by Nanosecond Response Ion Probe: Comparison With Optical Measurements*, by Mashburn et al. (Solid State Div. Oak Ridge National Lab., Oak Ridge, TN.) Revised Nov. 1989.

Appl. Phys. Lett. 55(22), 27 Nov. 1989 Entitled: *Characterization of Ground–State Neutral and Ion Transport During Laser Ablation of $Y_1Ba_2Cu_3O_{7-x}$ Using Transient Optical Absorption Spectroscopy*, by Geohegan, et al.

*Characterization of Ground State Neutral and Ion Transport During Laser Ablation of 1:2:3 Superconductors by Transient Optical Absorption Spectroscopy*, by Geohegan, et al., (Solid State Division Oak Ridge Nat'l Lab., Oak Ridge, TN) Nov. 1989.

*Spectroscopic and Ion Probe Characterization of the Transport Process Following Laser Ablation of $YBa_2Cu_3O_x$*, by Geohegan et al., Apr., 1990 (Solid State Div. Oak Ridge National Lab., Oak Ridge, TN.).

*High Quality Epitaxial $YBaCu_{7-x}$ Thin Films at Moderate Temperatures by Pulsed Laser Ablation*, by Lowndes et al. (Solid State Division, Oak Ridge National Laboratory, Oak Ridge, TN).

*Epitaxial Films of $Y_1Ba_2Cu_3O_{7-\delta}$ on $NdGaO_3$, $LaGaO_3$, and $SrTiO_3$ Substrates Deposited by Laser Ablation*, by Koren et al. (Received 21 Nov. 1988; accepted for publication Jan. 16, 1989) Appl. Phys. Lett 54 (11), 13 Mar. 1989, American Institute of Physics.

*Epitaxial Growth of $YBa_2Cu_3O_{7-x}$ Thin Films by a Laser Evaporation Process*, by Roas et al(Received 27 Jul. 1988; accepted for publication 26 Aug. 1988) Appl. Phys. Lett. 53 (16), 17 Oct. 1988, American Institute of Physics.

(List continued on next page.)

Primary Examiner—Tu Hoang
Attorney, Agent, or Firm—E. A. Pennington; J. A. Marasco; H. W. Adams

[57] ABSTRACT

A laser ablation apparatus having a laser source outputting a laser ablation beam includes an ablation chamber having a sidewall, a beam divider for dividing the laser ablation beam into two substantially equal halves, and a pair of mirrors for converging the two halves on a surface of the target from complementary angles relative to the target surface normal, thereby generating a plume of ablated material emanating from the target.

20 Claims, 2 Drawing Sheets

OTHER PUBLICATIONS

*Y–Ba–Cu–O Thin Films Grown on Rigid and Flexible Polycrystalline Yttria–Stabilized Zirconia by Pulsed Laser Ablation;* by Norton et al., Journal of Applied Physics 68, (1), pp. 223–227, 1990.

*In–Situ Growth of Superconducting $Yba_2Cu_3O_y$ Films by Pulsed Laser Deposition,* by Boyce et al., SPIE vol. 1187 Processing Films for High $T_c$ Superconducting Electronic (1989).

*Layered Growth of HTSC Thin Films Using Pulsed Laser Deposition,* by Kawai et al., SPIE vol. 1187 Processing of Films for High $T_c$ Superconducting Electronics (1989).

*Physics of In–Situ Laser Deposition of Superconducting Thin Films,* by Kwok et al. (Institute of Superconductivity State University of New York at Buffalo, Bonner Hall, Amherst, NY, SPIE vol. 1187 Processing Films for High $T_c$ Superconducting Electronic (1989).

*Particulates Reduction in Laser–Ablated $YBa_2Cu_3O_{7-\delta}$ Thin Films by Laser–Induced Plume Heating,* by Koren et al. (Received 27 Oct. 1989; accepted for publication 27 Mar. 1990), Appl. Phys. Lett 56 (21), 21 May 1990; American Institute of Physics.

*Artificial and Non–Equilibrium Materials Synthesizer Development,* prepared by Mashburn et al. (Solid State Division Oak Ridge National Laboratory, Jun. 1990).

*LPX The 5th Generation in Excimer Lasers,* (Lambdaphysik—Lasertechnik, A Subsidiary of Coherent)—1988 Product Brochure.

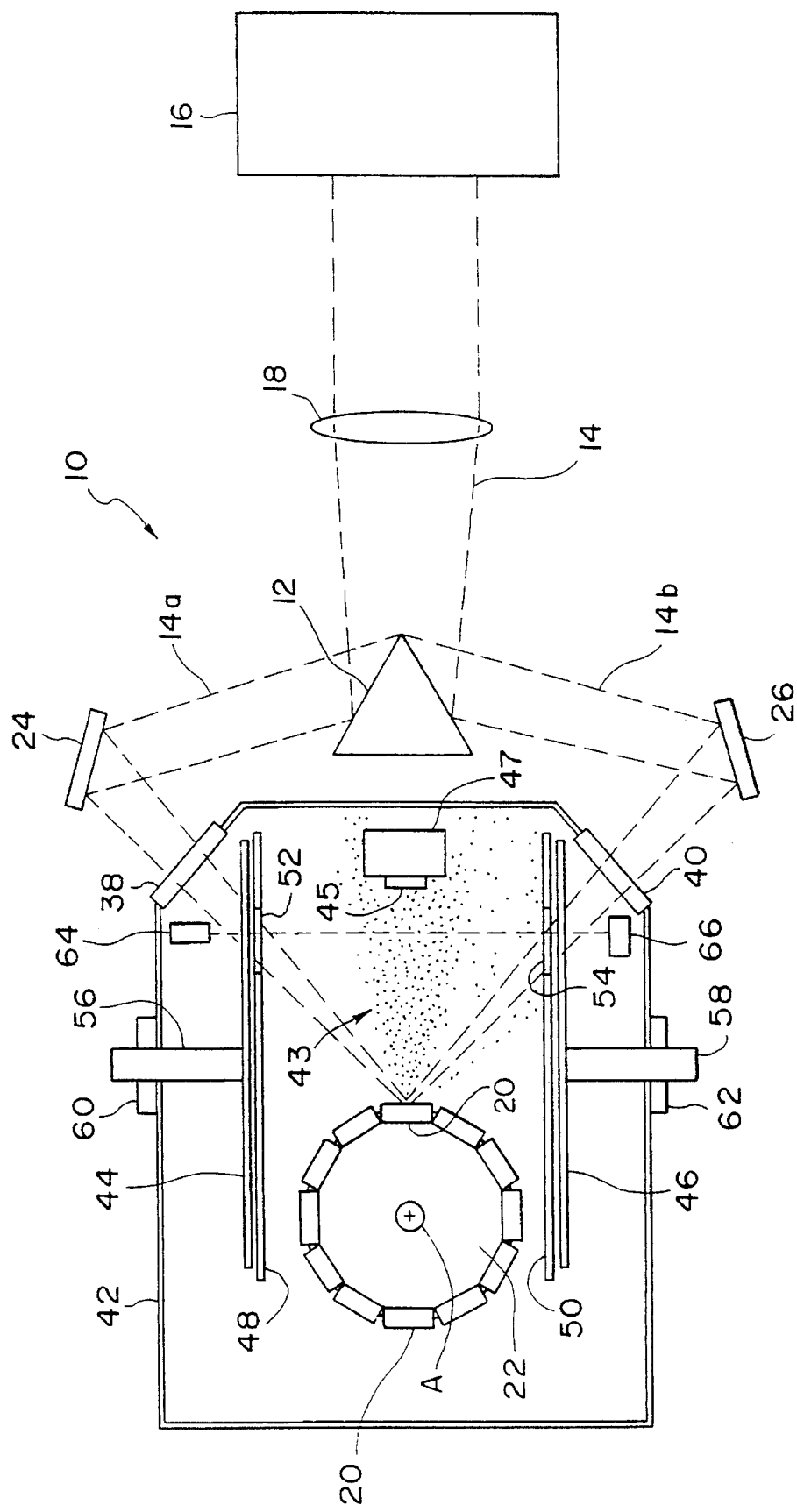

DUAL BEAM OPTICAL SYSTEM FOR PULSED LASER ABLATION FILM DEPOSITION

This invention was made with Government support under contract DE-AC05-84OR21400 awarded by the U.S. Department of Energy to Martin Marietta Energy Systems, Inc. and the Government has certain rights in this invention.

FIELD OF THE INVENTION

The present invention relates generally to thin film deposition and, more specifically, to a pulsed laser ablation film deposition technique in which the ablation laser is divided into two equal halves which converge from complementary angles on a target material. The recombined laser beam halves generate a plume of target material which is normal to the target surface. The ablation plume composition is more uniform, resulting in a more uniform film.

BACKGROUND OF THE INVENTION

Laser ablation, or laser evaporation deposition (LEDE) is a known technique for growing thin films on a substrate. The technique has been used to deposit high temperature superconductor materials as thin films on a variety of substrates.

An apparatus for performing laser ablation deposition, representative of the prior art, is seen in FIG. 1. The apparatus includes a vacuum chamber 1, a thermomolecular pump 2 which imparts a vacuum in the chamber 1, and a gas manifold. A pulsed laser beam 3 from a KrF source (not shown) is focused by a cylindrical lens 4, through a quartz window 5, onto a target pellet 6 made of superconductor material, such as $YBa_2Cu_3O_7$.

The beam 3 striking the pellet 6 generates a plume 7 containing the target material. The material is then deposited on a substrate 8 mounted on a heater 9. Typical of the prior art, the target pellet 6 is caused to rotate during ablation, as shown by the directional arrow.

In the pulsed laser ablation process with a smooth flat target surface, the initial plume direction is normal to the surface and nearly independent of the laser beam incident angle. For the deposition of thin films to take place properly, the film substrate must be placed so as to intercept the plume, and the optimum placement is usually found to be on the target normal.

For multipulse depositions, the laser cannot pass through the film or it will ablate it away, negating the whole effort. Consequently, the laser beam incident angle must be off normal.

In depositing high temperature superconductors such as YBCO by laser ablation, it has been found that texturing of the target surface occurs as the laser ablates away material with repeated pulses, and a typical film may need thousands of pulses. This texturing creates microscopic finger-like projections pointing back along the laser beam. These cause a steering of the ablation plume away from the target normal and toward the laser beam. The more pronounced these projections become, the more steering they produce. Both film thickness per pulse and film composition (at least for YBCO composite targets) are affected, causing severe degradation of film quality and repeatability unless steps are taken to control texturing.

It has been suggested that allowing buildup of the texturing increases the generation of large ablation particles which can degrade the film. Thus, most prior art laser ablation techniques have employed target rotation or translation as a means of reducing the effect of texturing.

A technique that I had previously proposed used a laser beam that scans up and down across the disk's diameter at 1/10 the rotation rate.

However, this technique produces a plume which moves up and down as the laser beam scans. A moving plume is troublesome for ablation processes where there is a need to keep the plume in a fixed location relative to the chamber.

Another laser/optical problem in laser ablation deposition is the need for high spatial uniformity of the laser beam incident on the target in order to get uniform film composition. This requirement is typically met with existing excimer lasers by masking off all but the center of the laser beam, thus wasting 50 to 70% of the laser pulse energy.

More sophisticated laser resonator optics can reduce the amount of masking needed, but they reduce the total energy extractable from a given laser, so that little gain in overall efficiency is achieved. The laser operating cost is probably the most significant economic factor for large scale use of the laser ablation deposition process, so efficient utilization of the laser light is imperative.

Another problem experienced by laser ablation processes is laser beam entrance window fogging or contamination by the ablation plume. This can cause a 50% loss in laser energy delivered to the target after a few thousand pulses, thus requiring that the windows be removed and cleaned after a few films have been deposited. This is clearly a production bottleneck for any large scale use of the process, but even in research use, it costs time and money to remove and clean the windows. Moreover, window cleaning can lead to contamination of the vacuum chamber with air and moisture. Also, exact process conditions which produce a given research sample cannot be guaranteed since significant fogging can occur in a single film run.

SUMMARY OF THE INVENTION

An object of the present invention is to provide a laser ablation deposition apparatus and method capable of smoothing out the intensity profile of the beam, thereby giving more uniform illumination of the ablation spot, more uniform plume composition, and thus, a more uniform film.

Another object of the present invention is to provide a laser ablation apparatus and method capable of removing material and leaving a smooth surface.

Another object of the present invention is to provide a laser ablation deposition apparatus capable of avoiding window fogging and loss of laser energy resulting therefrom.

These and other objects of the invention are met by providing an optical system used in a laser ablation apparatus having a source outputting a laser ablation beam, which includes means for dividing the laser ablation beam into two substantially equal halves, and means for converging the two halves on a surface of a target material from complementary angles relative to the target surface normal.

Other objects, advantages and salient features of the invention will become apparent from the following detailed description, which taken in conjunction with the annexed drawings, discloses preferred embodiments of the invention.

BRIEF DESCRIPTION OF THE DRAWINGS

FIG. 2 is a schematic view of a laser ablation apparatus according to a preferred embodiment of the present invention.

DETAILED DESCRIPTION OF THE INVENTION

Figure 1:
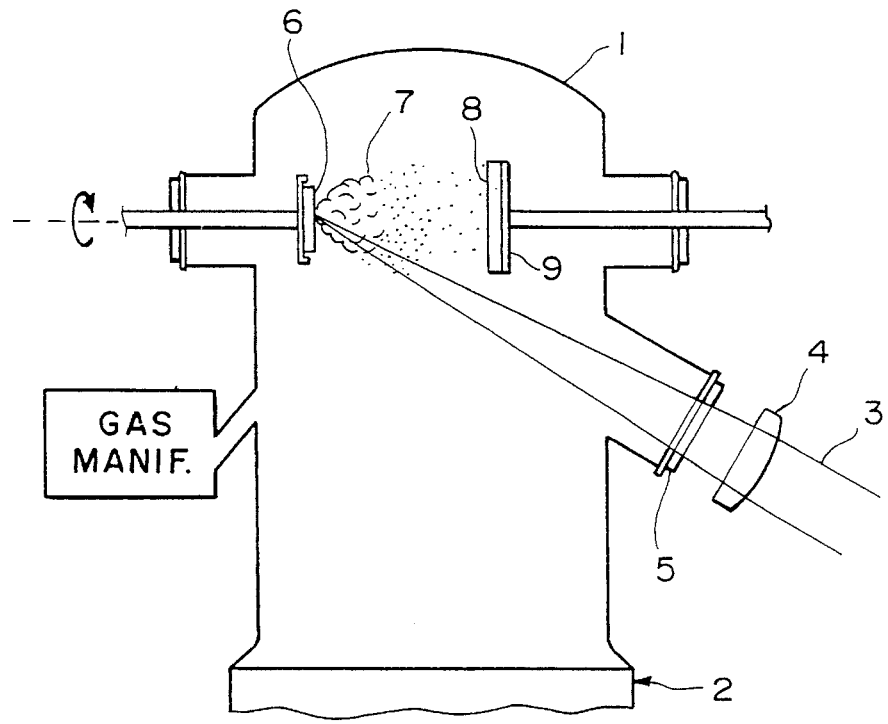
FIG. 1 is a schematic view of a known laser ablation apparatus using a single pulsed laser ablation beam.

Referring to FIG. 2, a laser ablation system 10 includes a reflecting beam divider 12 which splits a laser beam 14 into two equal upper and lower halves 14a and 14b. The divider 12 is a optical mirrored wedge having reflective surfaces. The laser beam 14 is output from a source 16 and focused by a focusing lens 18 through the optical train to ultimately focus on a target of material to be ablated. The beam can be a pulsed 248 nm (25 ns FWHM) light from a KrF excimer laser source, which is commercially available as the "Lumonics 861T". The output beam 14 is rectangular, which is typical of excimer lasers; other geometrics could be used, but rectangular is preferred. Other lasers can be used, such as a $CO_2$ laser and a YAG laser.

A plurality of targets 20 are mounted on a periphery of a drum 22, which is rotatable about its axis "A". Each target 20 is made of a material which is to be ablated by the laser beam. The materials ,may be used in making high temperature superconductors, such as Y-123, thallium, and bismuth families. Other examples included semiconductors such as GaAlAs, GaInAs, HgCdTe, InSb, GaAs, etc.

Figure 3:
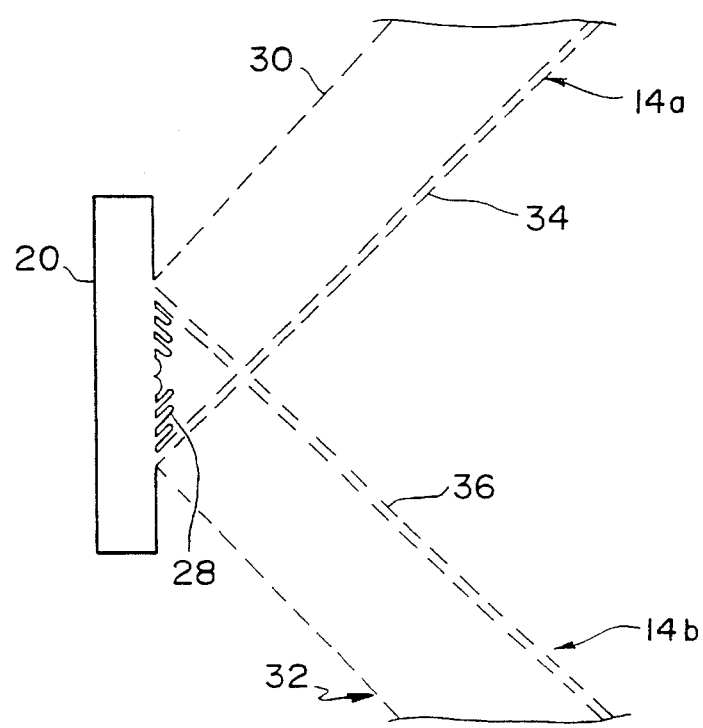
FIG. 3 is an enlarged schematic view of a target being ablated by two converging beam halves, with the resulting projecting fingers exaggerated in size for purposes of illustration.

Mirrors 24 and 26 are positioned to direct the two beam halves 14a and 14b, respectively, to converge at a common focus on the target 20 from complementary angles relative to the target normal. The two beams have a symbionic effect on each other in that one tends the negate the target texturing effect of the other. As seen in FIG. 3, the upper beam 14a strikes the sides of the finger-like projections formed by the lower beam 14b. similarly, the lower beam 14b strikes the sides of those formed by the upper beam 14a.

In effect, the tendency to form the projections is canceled continuously from the start, keeping the target smooth. This allows the ablation plume to remain normal to the target surface as material is ablated away, in contrast to the situation that exists in conventional arrangements with only one beam. It is still necessary to move the target about relative to the beam intersection point so as to use the target more efficiently, otherwise the material removal will dig a hole.

It is only necessary to translate the target with this arrangement, not rotate and translate. However, it is still possible with this arrangement to rotate a simple disk target about an axis normal to its face if desired. The translate only feature is needed by the apparatus of FIG. 2 where the target 20 is one of many cylindrical segments on a rotating drum 22. In this case, the rotation axis is perpendicular to the plane of the incident laser beams, so that different target materials can be rapidly selected. Scanning of the beam across the target segment is accomplished by dithering the firing time of the laser relative to the drum rotation angle which is equivalent to simple translation.

The second advantage of using the divided beam arrangement is to take a typical gaussian spatial intensity profile from the laser which is most intense at the center, split it upper and lower, and then recombine the two halves at the target such that the less intense edges are overlapped by the more intense centers. As seen in FIG. 3, when the beam 14 is split, a cooler (less intense) top edge 30 of the beam 14 is located in the upper half 14a and the cooler bottom edge 32 is located in the lower half 14b. The hotter middle portion of the beam is located in both halves along edges 34 and 36. This overlapping low and high intensity areas of the laser beam smooths out the intensity profile giving much more uniform illumination of the ablation spot. This helps to keep the ablation plume composition more uniform and results in more uniform films. The same principle can be applied to the left-right portions of the laser beam if desired, but here one would accomplish the effect with a very shallow prism upstream of the lenses. Typical excimer lasers do not suffer as much beam profile variation left to right as up and down. This technique can greatly reduce if not eliminate the need to mask off and discard the "non-uniform" portions of the laser beam as is currently practiced in laser ablation.

The two beam halves 14a and 14b pass through two quartz vacuum windows 38 and 40 to inter into the vacuum chamber 42. While the reflecting beam divider 12 is shown as a solid piece, it can be accomplished with two separate mirrors. Also, the embodiment of FIG. 2 shows the use of two windows 38 and 40, but this could be reduced to one by bringing the mirrors 24 and 26 and beam divider 12 inside the vacuum chamber 42. Since mirrors are used to direct the beam, it could also be brought in from the left as well, with the mirrors inside. Ablated material forms a plume 43 which extends substantially normal to a substrate 45 mounted on a support 47.

Window fogging protection means is provided by two quartz plates mounted inside the ablation vacuum chamber 42 so as to intercept any plume material that would otherwise strike the vacuum windows 38 and 40 and result in fogging and reduced energy transmission. The angle that the laser beam goes through the plates is chosen to be Brewster's angle which reduces the reflection loss at the plate to near zero for a polarized laser beam. Thin plates are preferred for cost, mounting, handling, and optical absorption minimization. Also, the plates 44 and 46 do not form part of the pressure boundary of the chamber 42, as do the windows 38 and 40, and can thus be thinner.

Mask plates 48 and 50 are mounted inside the quartz plates 44 and 46 to shield the unused areas of the quartz plates from the ablated material. The mask plates 48 and 50 can be any suitable metal or other vacuum compatible material. Each has a hole 52 and 54, respectively, sized to permit passage by respective beam halves.

When fogging of the beam area of the quartz plate occurs, a fresh area can be moved into place. For example, the quartz plates 44 and 46 can be disk-shaped, and rotated by shafts 56 and 58 connected to suitable actuators (not shown). The shafts 56 and 58 pass through seals 60 and 62, respectively, mounted in opposite sides of the chamber 42. As a result, a fresh area of the plates 48 and 50 can be selected without breaking the vacuum.

Since the plates can be much larger than the laser spot size, many fresh areas are available, permitting much longer operation of the ablation process before needing to replace the quartz plates 48 and 50. When replacement is needed, the plates are removed and cleaned in an acid solution in the case of high temperature superconductor materials. The plates are inexpensive compared to vacuum windows and could even be discarded.

Other arrangements of plates and actuators are possible. The plates could be rectangular with a translator to move them in two dimensions for maximum area usage. The actuator could be inside the vacuum chamber and electrically powered.

An on-line quartz plate transmission monitor can be used to determine when it is time to move the plates. As shown in FIG. 2, the monitor includes a light source 64 and photodetector 66. The arrangement permits the simultaneous transmission detection of both plates 44 and 46. The monitor could be connected to automatically index the plates to fresh areas when the transmission falls below a preset value, allowing very long uninterrupted ablation runs. The transmission monitor can use a simple laser if desired, or even an incoherent light source. The source and photodetector could be mounted outside the vacuum chamber if windows are provided.

The invention can be used with other conventional devices such as optical plume monitors, ion probe plume monitors, and heater/substrate holders. It is compatible with on-line optical and ion-probe plume monitoring. Simple plume monitoring techniques usually incorporate either a fixed optical beam through the chamber or a fixed ion probe. In order to compare successive plumes, probing is done in the same spatial part of the plume relative to the ablation spot on the target. If the spot is being scanned up and down or back and forth as is reported by some researchers as described hereinabove, then the monitors also have to be scanned accordingly. The use of dual beams solves the texturing problem with target motion alone, leaving the ablation spot fixed relative to the chamber.

Conceivably, the beam dividing and converging functions could be combined into a single optical device capable of directing two halves of the input beam onto the surface of the target.

The present invention results in more efficient use of the laser light and will give similar performance from a significantly less expensive laser than the conventional arrangement, because it does not need to aperture the laser in the manner used by most of the workers in the field of laser ablation today. The invention eliminates the texturing from the start, keeping the ablation process much more stable with target consumption.

The present invention also lends itself to the use of continuously fed targets such as a ribbon or rod. It works with a line focus which is optimum for most high power excimer lasers which have rectangular beam apertures and different horizontal and vertical beam divergences. Preferably, the beams are brought in symmetrically so that the plume interaction with the beam is uniform across the width of the plume and across the width of the beam.

Also, while the embodiment described herein uses a multi-segment drum target, it will be effective with a conventional disk target rotated about its axis with the ablation spot fixed (relative to the chamber). Higher and more uniform usage of such a target could be obtained if such a target's motion were compound as is typically used in an orbital sander or buffer. Here again, though, the laser beams and ablation spot would remain stationary. If one wanted to deposit films over large area substrates, the substrate would be moved back and forth or rotated and translated to expose the larger area to the fixed plume.

The present invention will be useful in laser ablation materials preparation or investigation research programs throughout government, private industry and university laboratories. It will be particularly valuable to any industrial manufacturing applications of laser ablation. It is anticipated to be useful in ablation applications where the object is simply to remove material, leaving a smooth surface as is the case in laser paint stripping, for example.

It is also expected to be useful in the construction of reliable, long running non-equilibrium materials deposition systems, and will be useful in materials analysis equipment where laser ablation is used to sample the surface being analyzed.

The aforementioned uses are by way of example, and not intended to be limiting.

Applications of the present invention go beyond mere film deposition. For example, laser eye surgery devices can use the dual beam concept to ensure a more smooth finished surface.

While advantageous embodiments have been chosen to illustrate the invention, it will be understood by those skilled in the art that various changes and modifications can be made therein without departing from the scope of the invention as defined in the appended claims.

What is claimed is:

1. A laser ablation apparatus comprising:

a pulsed light source outputting a pulsed light beam;

an ablation chamber having a sidewall;

means for focusing the pulsed light beam into the ablation chamber;

means, disposed within the ablation chamber, for supporting at least one target;

means for dividing the pulsed light beam into two substantially equal halves having the same spatial and temporal intensity profile; and means for directing the two halves to a surface of the target such that they arrive from complementary angles relative to the target surface normal, the two halves intersecting and overlapping at the target surface and having a summed energy and power per unit area sufficient to effect ablation of material from the target surface without producing texturing in the target surface, thereby generating a plume of ablated material emanating from the target, the summed energy and power per unit area being selected to produce a non-textured target surface and a desired characteristic of the plume.

2. A laser ablation apparatus according to claim 1, further comprising means, disposed within the ablation chamber, for supporting a substrate in line with the plume of ablated material.

3. A laser ablation apparatus according to claim 1, wherein the directing means comprises first and second mirrors positioned at complementary angles relative to the target surface normal.

4. A laser ablation apparatus according to claim 3, wherein the first and second mirrors are disposed outside the ablation chamber.

5. A laser ablation apparatus according to claim 4, further comprising first and second windows mounted in the sidewall of the ablation chamber and being positioned to pass respective ones of the two beam halves into the ablation chamber.

6. A laser ablation apparatus according to claim 4, further comprising shielding means disposed between the target and the first and second windows for preventing ablated material from being deposited on the first and second windows.

7. A laser ablation apparatus according to claim 6, wherein the shielding means comprises first and second transparent plates disposed respectively between the target and the first and second windows.

8. A laser ablation apparatus according to claim 7, further comprising first and second masks disposed between the target and the first and second transparent plates, respectively, each of the first and second masks having an opening sized and positioned to permit passage of each respective beam half therethrough.

9. A laser ablation apparatus according to claim 8, further comprising means for moving the first and second transparent plates relative to the first and second masks, respectively.

10. A laser ablation apparatus according to claim 1, wherein the dividing means comprises an optical mirrored wedge disposed outside the ablation chamber, and the directing means comprises first and second mirrors positioned at complementary angles relative to the target surface normal.

11. A laser ablation apparatus according to claim 1, wherein the focusing means comprises a focusing lens disposed outside the ablation chamber between the laser source and the dividing means.

12. A laser ablation apparatus according to claim 1, wherein the laser source is a pulsed excimer laser having a rectangular and the target material is a solid.

13. A laser ablation apparatus according to claim 1, wherein the two beam halves have a greater intensity edge and a lesser intensity edge, the two beam halves intersecting at the target with the less intensity edge of one half being overlapped by the greater intensity edge of the other.

14. A laser ablation apparatus comprising:
   an ablation chamber having a sidewall;
   at least one transparent window mounted in the sidewall;
   means for supporting at least one target within the ablation chamber;
   at least one light transmissive shield disposed between the at least one window and the target; and a mask juxtaposed the transparent plate and having an opening sized and positioned to permit passage of a laser ablation beam therethrough.

15. A laser ablation apparatus according to claim 14, wherein the shield includes a transparent plate mounted in the ablation chamber between the at least one window and the target.

16. A laser ablation apparatus according to claim 14, further comprising means for moving the transparent plate relative to the mask.

17. A laser ablation apparatus according to claim 16, further comprising a laser source outputting a laser ablation beam, means for dividing the laser ablation beam into two substantially equal halves, and means for converging the two halves on a surface of the target from complementary angles relative to the target surface normal.

18. A laser ablation apparatus according to claim 17, wherein the at least one window includes first and second windows, and the at least one light transmissive shield comprises first and second light transmissive shields disposed respectively between the first and second windows and the target.

19. A laser ablation method comprising:
   outputting a pulsed light beam from a light source;
   focusing the pulsed light beam into an ablation chamber having a sidewall;
   supporting at least one target in the ablation chamber;
   dividing the pulsed light beam into two substantially equal halves having the same spatial and temporal intensity profile; and
   directing the two halves to a surface of the target such that they arrive from complementary angles relative to the target surface normal,
   the two halves intersecting and overlapping at the target surface and having a summed energy and power per unit area sufficient to effect ablation of material from the target surface without producing texturing in the target surface, thereby generating a plume of ablated material emanating from the target,
   the summed energy and power per unit area being selected to produce a non-textured target surface and a desired characteristic of the plume.

20. A laser ablation method according to claim 19, wherein the two beam halves have a greater intensity edge and a lesser intensity edge, the two beam halves intersecting at the target with the less intensity edge of one half being overlapped by the greater intensity edge of the other.

* * * * *